United States Patent
Wang et al.

(10) Patent No.: US 11,069,723 B2
(45) Date of Patent: Jul. 20, 2021

(54) METHOD FOR MANUFACTURING THIN FILM TRANSISTOR, THIN FILM TRANSISTOR, AND DISPLAY APPARATUS

(71) Applicant: CHENGDU CEC PANDA DISPLAY TECHNOLOGY CO., LTD., Chengdu (CN)

(72) Inventors: Shuaiyi Wang, Chengdu (CN); Hui Tang, Chengdu (CN); Peng Gao, Chengdu (CN); Ke Zeng, Chengdu (CN); Xiangfeng Li, Chengdu (CN)

(73) Assignee: Chengdu CEC Panda Display Technology Co., Ltd., Chengdu (CN)

( * ) Notice: Subject to any disclaimer, the term of this patent is extended or adjusted under 35 U.S.C. 154(b) by 0 days.

(21) Appl. No.: 16/756,934

(22) PCT Filed: Mar. 23, 2020

(86) PCT No.: PCT/CN2020/080724
§ 371 (c)(1),
(2) Date: Apr. 17, 2020

(87) PCT Pub. No.: WO2020/233220
PCT Pub. Date: Nov. 26, 2020

(65) Prior Publication Data
US 2021/0082965 A1 Mar. 18, 2021

(30) Foreign Application Priority Data
May 22, 2019 (CN) .......................... 201910431451.3

(51) Int. Cl.
*H01L 21/00* (2006.01)
*H01L 27/12* (2006.01)
*H01L 21/423* (2006.01)

(52) U.S. Cl.
CPC .......... *H01L 27/127* (2013.01); *H01L 21/423* (2013.01)

(58) Field of Classification Search
CPC .......................... H01L 27/127; H01L 21/423
See application file for complete search history.

(56) References Cited

U.S. PATENT DOCUMENTS 5,273,920 A * 12/1993 Kwasnick ........... H01L 21/3003
148/DIG. 1
5,281,546 A * 1/1994 Possin ................. H01L 21/3003
148/DIG. 1

* cited by examiner

*Primary Examiner* — Richard A Booth
(74) *Attorney, Agent, or Firm* — MacMillan, Sobanski & Todd, LLC

(57) ABSTRACT

The present disclosure provides a method for manufacturing a thin film transistor, a thin film transistor, and a display apparatus. The method for manufacturing a thin film transistor includes: forming a gate layer on a substrate; forming a gate insulating layer on the gate layer; forming an active layer on the gate insulating layer; forming a source/drain layer on the active layer; and performing a plasma bombardment treatment on a surface of the active layer on which the source/drain layer is formed, and controlling the plasma bombardment treatment to be performed at a gas flow rate of 4K sccm to 70K sccm, at a pressure of 600 mTorr to 1200 mTorr, at a power of 4 KW to 12 KW for a treatment time of 10 s to 60 s.

20 Claims, 6 Drawing Sheets

METHOD FOR MANUFACTURING THIN FILM TRANSISTOR, THIN FILM TRANSISTOR, AND DISPLAY APPARATUS

CROSS-REFERENCE TO RELATED APPLICATIONS

Priority

This application is a U.S. national application of the international application number PCT/CN2020/080724 filed on Mar. 23, 2020, which claims priority of Chinese national application CN201910431451.3 filed on May 22, 2019, the contents of all of which are incorporated herein by reference.

TECHNICAL FIELD

The present disclosure relates to the field of display technologies, and in particular to a method for manufacturing a thin film transistor, a thin film transistor, and a display apparatus.

BACKGROUND ART

Liquid crystal display panels have many advantages such as thin body, power saving, and no radiation, and therefore have been widely used and have dominated the flat panel display field. The liquid crystal display panel generally comprises an array substrate, a color filter substrate, and a liquid crystal layer sandwiched between the array substrate and the color filter substrate. A traditional vertical alignment (referred simply to as VA) type liquid crystal display panel has an array substrate that is generally provided with thin film transistors (referred simply to as TFT) arranged in a matrix, wherein the TFTs are used as pixel drive components for active-matrix liquid crystal display (AMLCD) screens and active-matrix organic light-emitting diodes (AMOLED) to play an important role in achieving displaying over a large area, with high definition and at a high frame rate.

The current TFTs consist mainly of active layers, insulating layers, metal electrodes, and so on, wherein the TFTs are divided mainly into amorphous silicon (a-Si: H) TFTs, low temperature polysilicon (LTPS) TFTs, organic TFTs and oxide TFTs according to the types of the materials of the semiconductor active layers, wherein the oxide TFTs may have active layers made of IGZOs and may be divided into an etch stop layer (ESL) structure and a back channel-etched (referred simply to BCE) structure according to whether there is an etch stop layer on the active layer, wherein the back channel etched (BCE) structure refers to a TFT device structure formed by etching S/D electrodes directly on the active layer, wherein an indium-gallium-zinc oxide (IGZO) TFT having a BCE structure is specifically manufactured by process steps of: forming a gate on a substrate, forming a gate insulating layer on the gate, forming an active layer (i.e., IGZO) on the gate insulating layer, and forming S/D electrodes on the active layer by BCE etching.

However, in the TFT manufactured by the above process, the etchant tends to cause damage to the IGZO surface and an increase in roughness of the IGZO surface during etching, so that a more significant influence is created by the poor status of the IGZO back channel. As a result, the TFT device is easily affected by negative bias and light irradiation when it is being tested so that the characteristics are severely shifted in the negative direction, and the device is susceptible to aging and failure, which may greatly affect the product quality.

SUMMARY

The present disclosure provides a method for manufacturing a thin film transistor, a thin film transistor, and a display apparatus, so as to solve the problems of the prior art TFT devices which have characteristics severely shifted in the negative direction and are susceptible to aging due to the damage of the IGZO surface and the increase in roughness of the IGZO surface during etching. Embodiments of the present disclosure may be implemented, for example, in the following manner.

An embodiment of the present disclosure provides a method for manufacturing a thin film transistor, which may comprise:

forming a gate layer on a substrate;
forming a gate insulating layer on the gate layer;
forming an active layer on the gate insulating layer;
forming a source/drain layer on the active layer; and
performing a plasma bombardment treatment on a surface of the active layer on which the source/drain layer is formed, and controlling the plasma bombardment treatment to be performed at a gas flow rate of 4K sccm to 70K sccm, at a pressure of 600 mTorr to 1200 mTorr, at a power of 4 KW to 12 KW for a treatment time of 10 s to 60 s.

Optionally, performing a plasma bombardment treatment on the surface of the active layer on which the source/drain layer is formed includes:

performing a plasma bombardment treatment by using at least one gas of $N_2O$, $O_2$, Ar, and $N_2$ on the surface of the active layer on which the source/drain layer is formed, and controlling the gas flow rate in a range of 4K sccm to 70K sccm, the pressure in a range of 600 mTorr to 1200 mTorr, the power in a range of 4 KW to 12 KW, and the treatment time in a range of 10 s to 60 s.

Optionally, performing a plasma bombardment treatment on the surface of the active layer on which the source/drain layer is formed includes:

performing a plasma bombardment treatment by using one gas of $N_2O$, $O_2$, Ar, and $N_2$ on the surface of the active layer on which the source/drain layer is formed, and controlling the gas flow rate in a range of 30K sccm to 70K sccm, the pressure in a range of 600 mTorr to 1200 mTorr, the power in a range of 4 KW to 12 KW, and the treatment time in a range of 10 s to 40 s.

Optionally, performing a plasma bombardment treatment on the surface of the active layer on which the source/drain layer is formed includes:

performing a plasma bombardment treatment by using two gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

Optionally, a ratio of the gas flow rates of the two gases of $N_2O$, $O_2$, Ar, and $N_2$ is between 1:4 and 4:1.

Optionally, performing a plasma bombardment treatment on the surface of the active layer on which the source/drain layer is formed includes:

performing a plasma bombardment treatment by using three gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

Optionally, performing a plasma bombardment treatment on the surface of the active layer on which the source/drain layer is formed includes:

performing a plasma bombardment treatment by using a gas mixture of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

Optionally, after performing the plasma bombardment treatment on the surface of the active layer on which the source/drain layer is formed, the method further comprises:

disposing a protective layer on the active layer on which the source/drain layer is formed and on a top surface of the source/drain layer.

An embodiment of the present disclosure further provides a thin film transistor manufactured by using any of the methods described above.

An embodiment of the present disclosure further provides a display apparatus. The display apparatus may comprise at least the thin film transistor described above.

In the method for manufacturing a thin film transistor, the thin film transistor, and the display apparatus according to the present disclosure, during the manufacture of the thin film transistor, a gate layer is first formed on a substrate, then a gate insulating layer is formed on the gate layer, next an active layer is formed on the gate insulating layer, subsequently a source/drain layer is formed on the active layer, and finally a plasma bombardment treatment is performed on a surface of the active layer on which the source/drain layer is formed. By subjecting the surface of the active layer on which the source/drain layer is formed to bombardment treatment with a plasma, the surface of the IGZO back channel can be smoothed and surface defects of the IGZO back channel can be reduced, and the characteristics of the TFT device are optimized, so that the TFT device exhibits more stable characteristics. Thus, the method for manufacturing a thin film transistor, the thin film transistor, and the display apparatus according to the embodiments of the present disclosure can solve the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

BRIEF DESCRIPTION OF DRAWINGS

In order to more clearly illustrate technical solutions of embodiments of the present disclosure or of the prior art, drawings required for use in the description of the embodiments or the prior art will be described briefly below. It is obvious that the drawings in the following description are illustrative of some embodiments of the present disclosure. It will be understood by those of ordinary skill in the art that other drawings can also be obtained from these drawings without any inventive effort.

DETAILED DESCRIPTION OF EMBODIMENTS

In order to further clarify the objects, technical solutions, and advantages of the embodiments of the present disclosure, the technical solutions of the embodiments of the present disclosure will be described below clearly and completely with reference to the accompanying drawings of the embodiments of the present disclosure. It is apparent that the embodiments to be described are some, but not all of the embodiments of the present disclosure. All the other embodiments obtained by those of ordinary skill in the art in light of the embodiments of the present disclosure without inventive efforts will fall within the scope of the present disclosure as claimed.

The terms "including" and "comprising" and any variants thereof used in the description, the claims, and the above accompanying drawings of the present disclosure are intended to cover non-exclusive inclusions, and for example, a process, method, system, product, or device that includes a list of steps or units is not necessarily limited to those steps or units expressly listed, but may include other steps or units not expressly listed or inherent to such a process, method, product, or device.

As described in the Background Art section, a prior art indium-gallium-zinc oxide (IGZO) TFT having a BCE structure is specifically manufactured by process steps of: forming a gate on a substrate, forming a gate insulating layer on the gate, forming an active layer (i.e., IGZO) on the gate insulating layer, and forming S/D electrodes on the active layer by BCE etching. However, in the TFT manufactured by the above process, the etchant tends to cause damage to the IGZO surface and an increase in roughness of the IGZO surface during etching, so that a more significant influence is created by the poor status of the IGZO back channel. As a result, the TFT device is easily affected by negative bias and light irradiation in a BT test so that the characteristics are severely shifted in the negative direction, and the device is susceptible to aging and failure, which may greatly affect the product quality. In order to solve the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching, embodiments of the present disclosure provide a method for manufacturing a thin film transistor, a thin film transistor, and a display apparatus.

Figure 2:
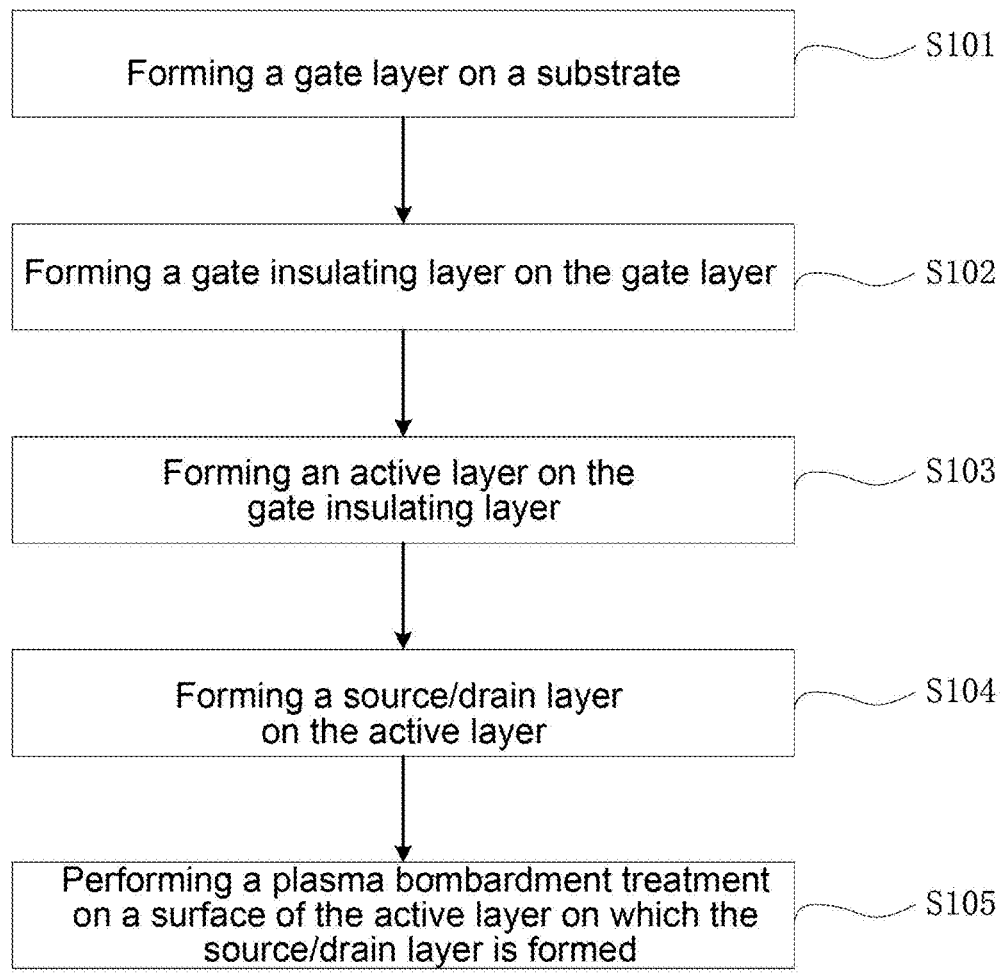
FIG. 2 is a schematic flowchart of a method for manufacturing a thin film transistor according to an embodiment of the present disclosure.
Figure 3:
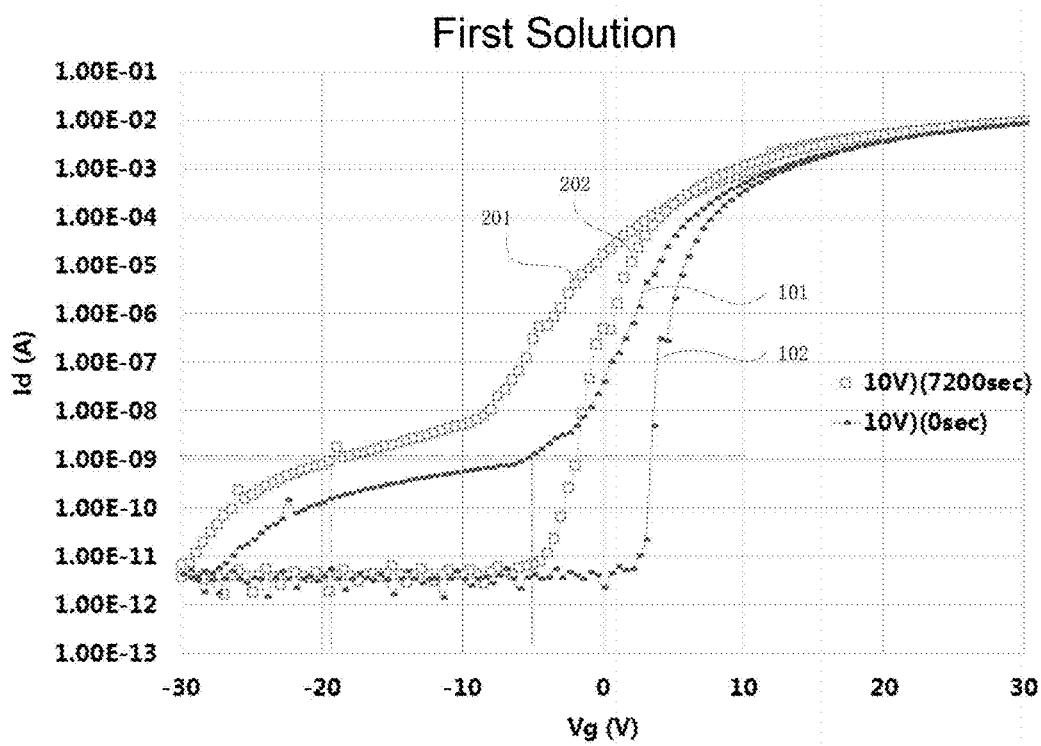
FIG. 3 is a graph showing results of a LNBT aging test of a thin film transistor according to the embodiment.

FIG. 2 is a schematic flowchart of a method for manufacturing a thin film transistor according to an embodiment of the present disclosure, and FIG. 3 is a graph showing results of a LNBT test of a thin film transistor according to the embodiment.

The method for manufacturing a thin film transistor according to this embodiment can be used for manufacturing a thin film transistor, and is particularly suitable for manufacturing a thin film transistor having a back channel etched (BCE) structure. A method for manufacturing a thin film transistor according to this embodiment can solve the problems of the prior art TFT devices which have characteristics severely shifted in the negative direction and are susceptible to aging due to the damage of the IGZO surface and the increase in roughness of the IGZO surface during etching. As shown in FIG. 2, the method for manufacturing a thin film transistor according to an embodiment of the present disclosure may comprise:

step S101 of forming a gate layer on a substrate;

step S102 of forming a gate insulating layer on the gate layer;

step S103 of forming an active layer on the gate insulating layer;

step S104 of forming a source/drain layer on the active layer; and step S105 of performing a plasma bombardment treatment on a surface of the active layer on which the source/drain layer is formed.

Optionally, the plasma bombardment treatment may be controlled to be performed at a gas flow rate of 4K sccm to 70K sccm, at a pressure of 600 mTorr to 1200 mTorr, at a power of 4 KW to 12 KW for a treatment time of 10 s to 60 s.

Optionally, in this embodiment, it should be noted that plasma may be a state in which a substance exists. Generally, matter may exist in three states of solid, liquid, and gas, but in some special cases, there may be matter existing in a fourth state, for example, matter in the ionosphere in the Earth's atmosphere. Optionally, the matter present in the plasma state may include: electrons in a high-speed moving state; neutral atoms, molecules, and radicals (free radicals) in an activated state; ionized atoms and molecules; and unreacted molecules and atoms, etc., but the matter can still remain in an electrically neutral state as a whole. Optionally, the plasma bombardment treatment technology may be considered as a specific application of the special properties of the plasma. Optionally, the plasma may be generated by the following process. Two electrodes are disposed in a sealed container to form an electric field. A vacuum pump is used to achieve a certain degree of vacuum. As the gas becomes more and more rarefied, the spacing between molecules and the distance of free movement of molecules or ions are also getting longer and longer. They may collide to form plasmas under the action of the electric field. Since these plasmas have high activity, their energy is sufficient to break almost all chemical bonds and to cause a chemical reaction on any exposed surface. Moreover, plasmas of different gases may have different chemical properties. For example, a plasma of oxygen may have a high oxidizing property and can oxidize and react with a photoresist to generate a gas so as to achieve a cleaning effect. A plasma of a corrosive gas may have good isotropy so that it can meet the requirements for etching. Therefore, in a method for manufacturing a thin film transistor according to an embodiment of the present disclosure, a plasma bombardment treatment is performed on a surface of an active layer on which a source/drain layer is formed, so that the micro-level activity of the surface of the treated material (i.e., IGZO) can be enhanced. In this way, not only a damage of the IGZO surface and an increase in roughness of the IGZO surface during etching can be minimized so as to guarantee the quality of the IGZO surface, but also a coating effect can be significantly improved.

Optionally, in this embodiment, it should be noted that since a plasma is used for bombardment treatment in a method for manufacturing a thin film transistor according to this embodiment, this manufacturing method may have the following advantages, in addition to minimizing the damage of the IGZO surface and the increase in roughness of the IGZO surface during etching:

1) the plasma bombardment treatment process is easily automatically controlled by the digital control technology, so that the method for manufacturing a thin film transistor according to the present disclosure is highly automated;

2) the plasma bombardment treatment involves a high-precision control apparatus, thus time control in this manufacturing method is carried out with high precision;

3) it is ensured that the IGZO surface is not secondarily contaminated, because the plasma bombardment treatment is carried out in vacuum without polluting the environment.

Optionally, on the basis of this embodiment, in this embodiment, a plasma bombardment treatment is performed on a surface of the active layer on which the source/drain layer is formed. The plasma bombardment treatment may specifically include the step of:

performing a plasma bombardment treatment by using at least one gas of $N_2O$, $O_2$, Ar, and $N_2$ on the surface of the active layer on which the source/drain layer is formed. Specifically, in this embodiment, the surface of the active layer on which the source/drain layer is formed may be subjected to a plasma bombardment treatment by using one gas of $N_2O$, $O_2$, Ar, and $N_2$, wherein the process parameters in the plasma bombardment treatment process are controlled such that the gas flow rate is in a range of 30K sccm to 70K sccm, the pressure is in a range of 600 mTorr to 1200 mTorr, the power is in a range of 4 KW to 12 KW, and the treatment time is in a range of 10 s to 40 s. Optionally, the surface of the active layer on which the source/drain layer is formed may be subjected to a plasma bombardment treatment by using two gases of $N_2O$, $O_2$, Ar, and $N_2$. Optionally, the surface of the active layer on which the source/drain layer is formed may be subjected to a plasma bombardment treatment by using three gases of $N_2O$, $O_2$, Ar, and $N_2$.

Optionally, the surface of the active layer on which the source/drain layer is formed may be subjected to a plasma bombardment treatment with all the four gases of $N_2O$, $O_2$, Ar, and $N_2$. Optionally, in this embodiment, when performing a plasma bombardment treatment by using three or four gases of $N_2O$, $O_2$, Ar, and $N_2$ on the surface of the active layer on which the source/drain layer is formed, specifically, the gas flow rate may be controlled in a range of 4K sccm to 8K sccm, the pressure may be controlled in a range of 600 mTorr to 1200 mTorr, the power may be controlled in a range of 3 KW to 9 KW, and the treatment time may be controlled in a range of 10 s to 60 s.

Optionally, in this embodiment, it should be noted that since plasmas have high activity, their energy is sufficient to break almost all chemical bonds and to cause a chemical reaction on any exposed surface. Moreover, plasmas of different gases may have different chemical properties. For example, a plasma of oxygen may have a high oxidizing property and can oxidize and react with a photoresist to generate a gas so as to achieve a cleaning effect. Therefore, in an embodiment of the present disclosure, a plasma bombardment treatment is performed on a surface of an active layer on which a source/drain layer is formed, so that the micro-level activity of the surface of the treated material (i.e., IGZO) can be enhanced. In this way, not only a damage of the IGZO surface and an increase in roughness of the IGZO surface during etching can be minimized so as to guarantee the quality of the IGZO surface, but also a coating effect can be significantly improved, thereby effectively solving the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

Optionally, in the method for manufacturing a thin film transistor according to an embodiment of the present disclosure, after the IGZO is etched, the TFT device in which the source/drain layer is formed may be placed in a chemical vapor deposition (referred simply to as CVD) equipment or a dry etching equipment for a plasma bombardment treatment. Optionally, the dry etching equipment may have a superior capability in performing bombardment treatment on the surface of the IGZO (i.e., the active layer) to that of the CVD equipment. Optionally, in this embodiment, other equipment capable of performing plasma bombardment treatment on the surface of the active layer on which the source/drain layer is formed may also be used. In this embodiment, any equipment may be used as long as it can ensure a plasma bombardment treatment on the surface of the active layer on which the source/drain layer is formed.

Figure 1:
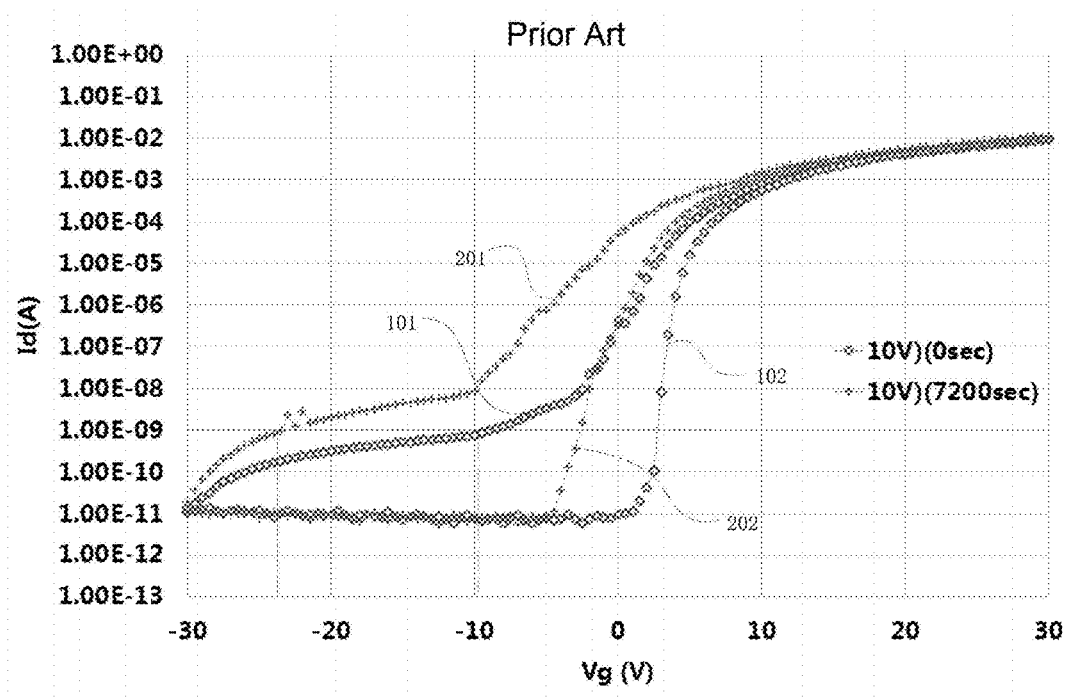
FIG. 1 is a graph showing results of a LNBT aging test of a prior art TFT device.

Optionally, in this embodiment, in order to further verify the advantageous effects of a method for manufacturing a thin film transistor according to this embodiment, a plasma bombardment treatment may specifically be performed with $N_2O$ on the surface of the active layer on which the source/drain layer is formed and may be controlled to be performed at a gas flow rate of 60K sccm, at a pressure of 900 mTorr, at a power of 6 KW for a treatment time of 30 s, and the fabricated TFT device and the prior art TFT device are subjected to LNBT aging tests. In the tests, as shown in FIG. 3, FIG. 1, FIG. 4, and FIG. 5, the test parameters are selected at 10 V (0 s) and 10 V (7200 s), respectively. Optionally, when the test parameter is 10 V (0 s), it may be indicated that the selected TFT device is operated at 10 V for 0 s; when the test parameter is 10 V (7200 s), it may be indicated that the TFT device has been operated at 10 V for 7200 s. In other words, the TFT device that has been operated at a voltage of 10 V for 7200 s is subjected to an aging test. Moreover, in each test, the TFT device may be tested in both forward and reverse directions. The forward test may specifically be carried out at a corresponding current Id value when a gate voltage Vg changes in a direction from –30 V to 30 V in FIG. 3, and the reverse test may be carried out at a corresponding current Id value when the gate voltage Vg changes in a direction from 30 V to –30 V. In this embodiment, as shown in FIG. 3 and FIG. 1, curve 101 in FIG. 3 may be a result of the forward test of the TFT device under a condition at a test parameter of 10 V (0 s), and curve 102 in FIG. 3 may be a result of the reverse test of the TFT device under a condition at a test parameter at 10 V (0 s), and correspondingly, curve 201 in FIG. 3 may be a result of the forward test of the TFT device under a condition at a test parameter of 10 V (7200 s), and curve 202 in FIG. 3 may be a result of the reverse test of the TFT device under a condition at a test parameter at 10 V (7200 s); curve 101 in FIG. 1 is a result of the forward test of the TFT device under a condition at a test parameter of 10 V (0 s), and curve 102 in FIG. 1 is a result of the reverse test of the TFT device under a condition at a test parameter at 10 V (0 s), and correspondingly, curve 201 in FIG. 1 is a result of the forward test of the TFT device under a condition at a test parameter of 10 V (7200 s), and curve 202 in FIG. 1 is a result of the reverse test of the TFT device under a condition at a test parameter at 10 V (7200 s). Compared with the test results in FIG. 1, when the current Id is $10^{-9}$ A, the gate voltage Vg corresponding to the curve 201 in the forward test in FIG. 3 is greater than the gate voltage Vg corresponding to the curve 201 in the forward test in FIG. 1 (see the dashed lines in FIG. 1 and FIG. 3), and correspondingly, the gate voltage Vg corresponding to the curve 101 in the forward test in FIG. 3 is greater than the gate voltage Vg corresponding to the curve 101 in the forward test in FIG. 1 (see the dashed lines in FIG. 1 and FIG. 3). Therefore, in this embodiment, the TFT device shows a reduced characteristic shift in the negative direction in comparison to the prior art.

Figure 6:
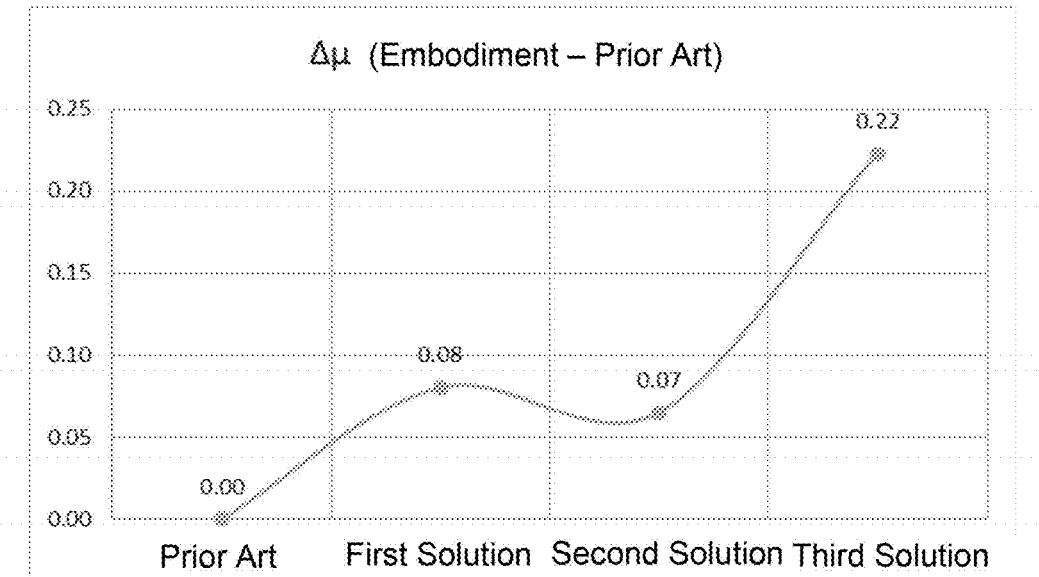
FIG. 6 is a graph showing comparison of $\Delta\mu$ test results of thin film transistors according to the embodiments of the present disclosure and the prior art.
Figure 7:
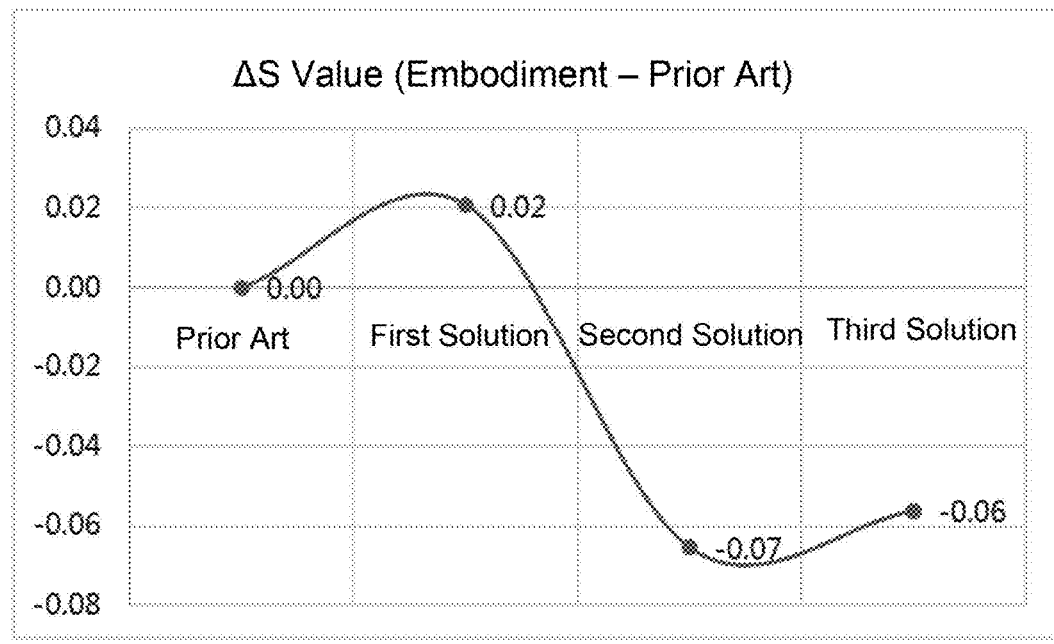
FIG. 7 is a graph showing comparison of $\Delta S$ test results of thin film transistors according to the embodiments of the present disclosure and the prior art.
Figure 8:
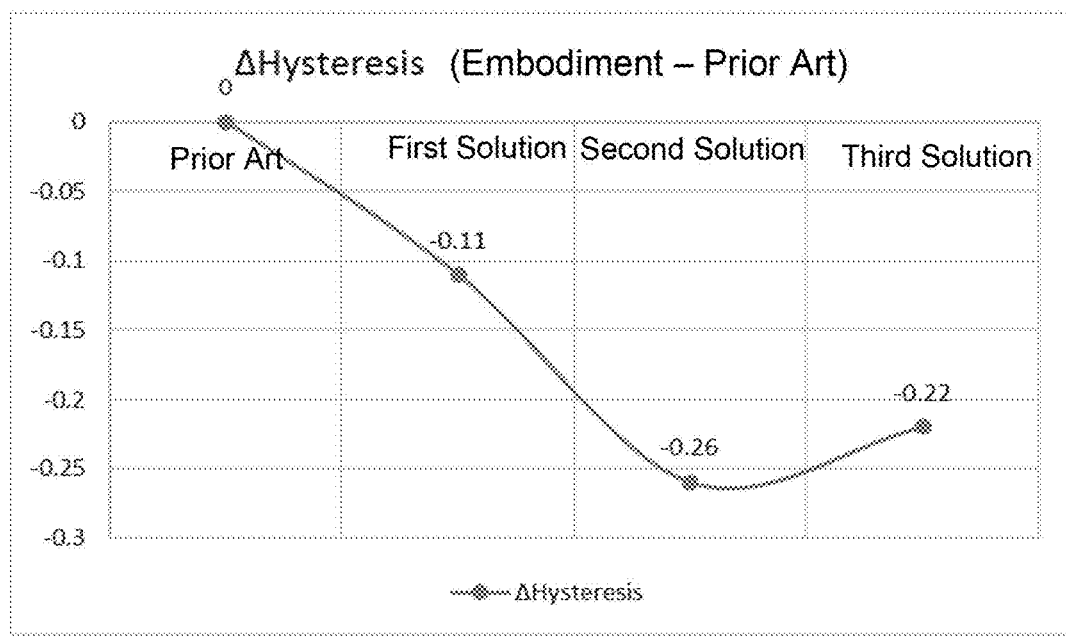
FIG. 8 is a graph showing comparison of $\Delta$Hysteresis test results of thin film transistors according to the embodiments of the present disclosure and the prior art.

At the same time, the TFT device manufactured by treatment with $N_2O$ is subjected to other aging tests. The test results are shown in FIG. 6 to FIG. 8. Optionally, the first solution in each of FIG. 6 to FIG. 8 may correspond to a test result of the TFT device manufactured by treatment with $N_2O$. It can be seen from FIG. 6 that after the IGZO surface is subjected to the plasma bombardment treatment with $N_2O$, the mobility p of the TFT device of the present disclosure is increased by 0.08 in comparison to the mobility p of the prior art TFT device. Correspondingly, as shown in FIG. 7, the sub-threshold swing S of the TFT device of the present disclosure is increased by 0.02 in comparison to the sub-threshold swing of the prior art TFT device. As shown in FIG. 8, a change in Hysteresis (i.e., a difference between the threshold voltages Vth(reverse)–Vth(forward)) of the TFT device of the present disclosure is reduced by 0.11 in comparison to the change in Hysteresis of the prior art TFT device. In summary, it can be seen that the TFT device manufactured by treatment with $N_2O$ can exhibit more stable characteristics. In other words, the plasma treatment contributes to the optimization of the characteristics of the IGZO back channel in the TFT device.

Optionally, the LNBT test needs to be performed by applying light irradiation and negative bias. However, the prior art IGZO has a poor surface state after being etched, and there are more impurities and surface defect states on the IGZO residues. Moreover, since oxygen vacancies on the IGZO surface are captured by water and $H^+$, new defect states may easily be excited when an aging test is performed under an environment with light irradiation and bias. When a negative bias is applied, the defect states are transitioned to the IGZO front channel, which results in a negative shift of the characteristics of the IGZO. With more defects, a more severe negative shift occurs. In contrast, in the present disclosure, the IGZO is subjected to a surface plasma treatment with $N_2O$, and the effect of the $N_2O$ plasma on the IGZO surface allows an effective suppression of detects and a reduction of oxygen vacancies on the IGZO back channel. Thus, the IGZO exhibits more stable characteristics due to fewer defects and oxygen vacancies on the IGZO back channel during the test with light irradiation and negative bias.

Optionally, in this embodiment, $N_2O$ is a corrosive gas which generates a plasma having good anisotropy and capable of better meeting the requirements for etching, thus $N_2O$ is preferably used in this embodiment for plasma bombardment treatment of the surface of the active layer on which the source/drain layer is formed to solve the problems of the prior art TFT devices which have characteristics severely shifted in the negative direction and are susceptible to aging due to the damage of the IGZO surface and the increase in roughness of the IGZO surface during etching.

Thus, in the manufacturing method of a thin film transistor according to the embodiment of the present disclosure, during the manufacture of the thin film transistor, a gate layer is first formed on a substrate, then a gate insulating layer is formed on the gate layer, next an active layer is formed on the gate insulating layer, subsequently a source/drain layer is formed on the active layer, and finally a plasma bombardment treatment is performed on a surface of the active layer on which the source/drain layer is formed. By subjecting the surface of the active layer on which the source/drain layer is formed to bombardment treatment with a plasma, the surface of the IGZO back channel can be smoothed and surface defects of the IGZO back channel can be reduced, and the characteristics of the TFT device are optimized, so that the TFT device can exhibit more stable characteristics. Therefore, the method for manufacturing a thin film transistor according to the embodiment of the present disclosure solves the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

Figure 4:
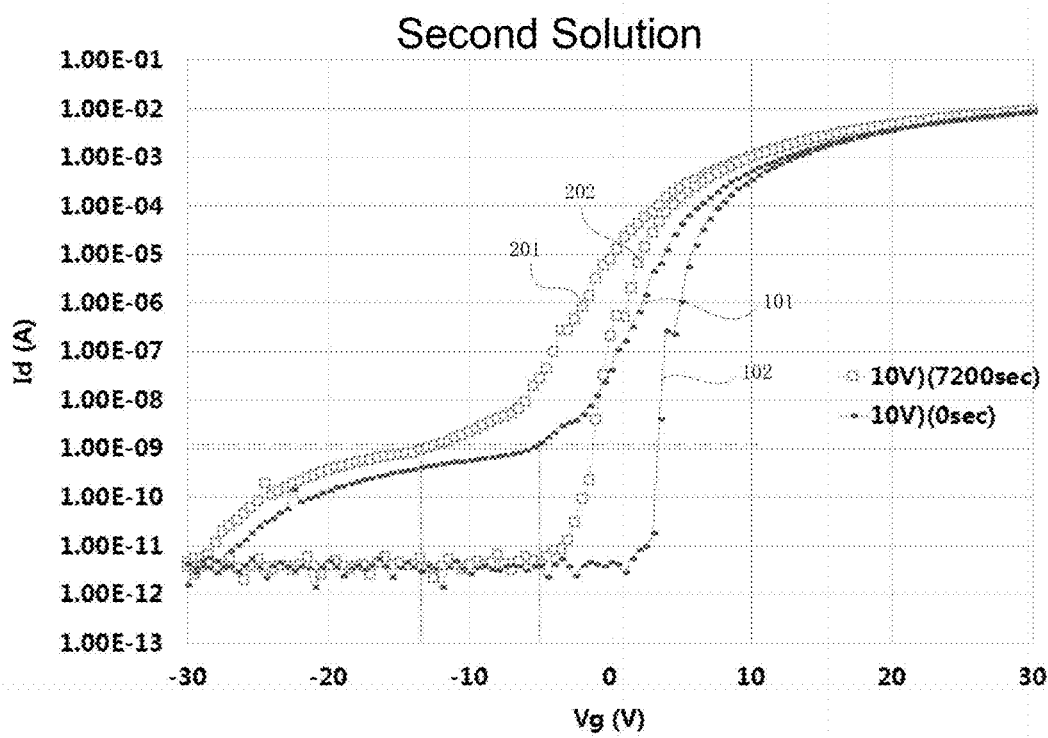
FIG. 4 is a graph showing results of a LNBT aging test of another thin film transistor according to an embodiment of the present disclosure.

FIG. 4 is a graph showing results of a LNBT aging test of another thin film transistor according to an embodiment of the present disclosure.

Optionally, on the basis of the thin film transistor according to the above embodiment, the plasma bombardment treatment to be performed on the surface of the active layer on which the source/drain layer is formed may alternatively include the step of:

performing a plasma bombardment treatment by using two gases of $N_2O$, $O_2$, Ar, and $N_2$ on the surface of the active layer on which the source/drain layer is formed, wherein the gas flow rate may be controlled in a range of 4K sccm to 8K sccm, the pressure may be controlled in a range of 600 mTorr to 1200 mTorr, the power may be controlled in a range of 3 KW to 9 KW, and the treatment time may be controlled in a range of 10 s to 60 s. Optionally, in this embodiment, for example, $N_2O$ and $O_2$, or $O_2$ and Ar, or Ar and $N_2$ may be used in the plasma bombardment treatment. Optionally, in this embodiment, any two of $N_2O$, $O_2$, Ar, and $N_2$ may be combined to perform plasma bombardment on the IGZO surface.

Optionally, in this embodiment, it should be noted that the two gases for use in the plasma bombardment treatment of the surface of the active layer on which the source/drain layer is formed in this embodiment may be preferably a gas mixture of Ar and $O_2$. The above plasma treatment systems are mixed for performing the plasma bombardment treatment on the surface of the active layer on which the source/drain layer is formed.

Optionally, in this embodiment, a ratio of the gas flow rates of $O_2$ and Ar may be between 1:4 and 4:1.

Optionally, in this embodiment, in order to further verify the advantageous effects of a method for manufacturing a thin film transistor according to this embodiment, a plasma bombardment treatment may specifically be performed with $O_2$ and Ar on the surface of the active layer on which the source/drain layer is formed and may be controlled to be performed at a gas flow rate of 5K sccm, at a pressure of 700 mTorr, at a power of 8 KW for a treatment time of 50 s with Ar and $O_2$ having a gas flow rate ratio of 2:3, and the fabricated TFT device is subjected to a LNBT aging test. In this embodiment, as shown in FIG. 4, curve 101 in FIG. 4 may be a result of the forward test of the TFT device under a condition at a test parameter of 10 V (0 s), and curve 102 in FIG. 4 may be a result of the reverse test of the TFT device under a condition at a test parameter at 10 V (0 s), and correspondingly, curve 201 in FIG. 4 may be a result of the forward test of the TFT device under a condition at a test parameter of 10 V (7200 s), and curve 202 in FIG. 4 may be a result of the reverse test of the TFT device under a condition at a test parameter at 10 V (7200 s). As can be seen from FIG. 4, when the current Id is $10^{-9}$ A, the gate voltage Vg corresponding to the curve 201 in the forward test in FIG. 4 is greater than the gate voltage Vg corresponding to the curve 201 in the forward test in FIG. 1, and correspondingly, the gate voltage Vg corresponding to the curve 101 in the forward test in FIG. 4 is greater than the gate voltage Vg corresponding to the curve 101 in the forward test in FIG. 1. Therefore, in this embodiment, the TFT device shows a reduced characteristic shift in the negative direction in comparison to the prior art.

At the same time, the TFT device manufactured by treatment with $O_2$ and Ar is subjected to other aging tests. The test results are shown as the second solution in FIG. 6 to FIG. 8. It can be seen from FIG. 6 that after the IGZO surface is subjected to the plasma bombardment treatment with $O_2$ and Ar, the mobility p of the TFT device of the present disclosure is increased by 0.07 in comparison to the mobility μ of the prior art TFT device. Correspondingly, as shown in FIG. 7, the sub-threshold swing S of the TFT device of the present disclosure is reduced by 0.07 in comparison to that of the prior art. As shown in FIG. 8, a change in hysteresis ΔHysteresis (i.e., a difference between the threshold voltages Vth(reverse)−Vth(forward)) of the TFT device of the present disclosure is reduced by 0.26 in comparison to that of the prior art. In summary, it can be seen that the TFT device manufactured by treatment with $O_2$ and Ar can exhibit more stable characteristics. This is because the LNBT test needs to be performed by applying light irradiation and negative bias. However, the prior art IGZO has a poor surface state after being etched, and there are more impurities and surface defect states on the IGZO residues. Moreover, since oxygen vacancies on the IGZO surface are captured by water and $H^+$, new defect states may easily be excited when an aging test is performed under an environment with light irradiation and bias. When a negative bias is applied, the defect states are transitioned to the IGZO front channel, which results in a negative shift of the characteristics of the IGZO. With more defects, a more severe negative shift occurs. In contrast, in the present disclosure, the IGZO is subjected to a surface plasma treatment with $O_2$ and Ar. On the one hand, Ar exhibits a good effect in treating the roughness of the IGZO surface. On the other hand, the effect of the $O_2$ plasma on the IGZO surface allows an effective suppression of detects and a reduction of oxygen vacancies on the IGZO back channel. Thus, the IGZO exhibits more stable characteristics due to fewer defects and oxygen vacancies on the IGZO back channel during the test with light irradiation and negative bias. In other words, the plasma treatment contributes to the optimization of the characteristics of the IGZO back channel in the TFT device.

Figure 5:
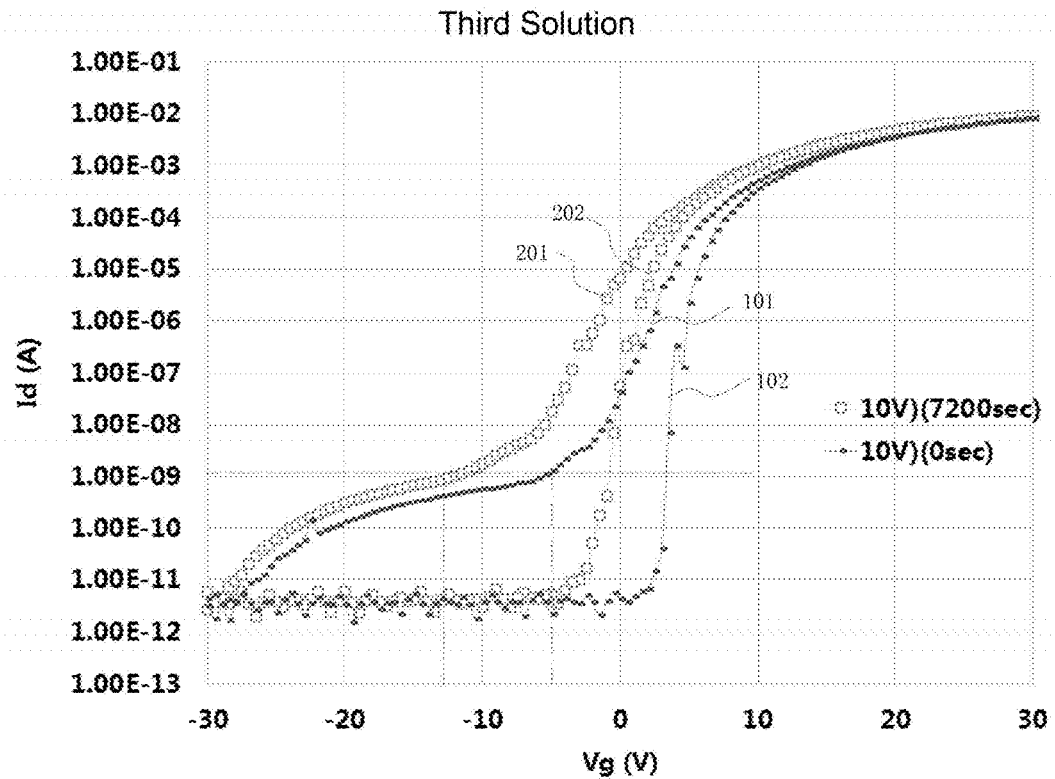
FIG. 5 is a graph showing results of a LNBT aging test of yet another thin film transistor according to an embodiment of the present disclosure.

FIG. 5 is a graph showing results of a LNBT aging test of yet another thin film transistor according to an embodiment of the present disclosure.

On the basis of the above embodiment, alternatively, in this embodiment, the two gases for use in the plasma bombardment treatment of the surface of the active layer on which the source/drain layer is formed may be preferably a gas mixture of $N_2O$ and $N_2$. The above plasma treatment systems are mixed for performing the plasma bombardment treatment on the surface of the active layer on which the source/drain layer is formed. Optionally, in this embodiment, during the plasma bombardment treatment, the gas flow rate may be controlled in a range of 4K sccm to 8K sccm, the pressure may be controlled in a range of 600 mTorr to 1200 mTorr, the power may be controlled in a range of 3 KW to 9 KW, and the treatment time may be controlled in a range of 10 s to 60 s. Optionally, in this embodiment, a ratio of the gas flow rates of $N_2O$ and $N_2$ may be between 1:4 and 4:1.

Optionally, in this embodiment, in order to further verify the advantageous effects of a method for manufacturing a thin film transistor according to this embodiment, a plasma bombardment treatment may specifically be performed with $N_2O$ and $N_2$ on the surface of the active layer on which the source/drain layer is formed and may be controlled to be performed at a gas flow rate of 5K sccm, at a pressure of 600 mTorr, at a power of 9 KW for a treatment time of 35 s with $N_2O$ and $N_2$ having a gas flow rate ratio of 4:1, and the fabricated TFT device is subjected to a LNBT aging test. In this embodiment, as shown in FIG. 5, curve 101 in FIG. 5 may be a result of the forward test of the TFT device under a condition at a test parameter of 10 V (0 s), and curve 102 in FIG. 5 may be a result of the reverse test of the TFT device under a condition at a test parameter at 10 V (0 s), and correspondingly, curve 201 in FIG. 5 may be a result of the forward test of the TFT device under a condition at a test parameter of 10 V (7200 s), and curve 202 in FIG. 5 may be a result of the reverse test of the TFT device under a condition at a test parameter at 10 V (7200 s). As can be seen from FIG. 5, when the current Id is $10^{-9}$ A, the gate voltage Vg corresponding to the curve 201 in the forward test in FIG. 5 is greater than the gate voltage Vg corresponding to the curve 201 in the forward test in FIG. 1, and correspondingly, the gate voltage Vg corresponding to the curve 101 in the forward test in FIG. 5 is greater than the gate voltage Vg corresponding to the curve 101 in the forward test in FIG. 1. Therefore, in this embodiment, the TFT device shows a reduced characteristic shift in the negative direction in comparison to the prior art.

At the same time, the TFT device manufactured by treatment with $N_2O$ and $N_2$ is subjected to other aging tests. The test results are shown as the third solution in FIG. 6 to FIG. 8. It can be seen from FIG. 6 that after the IGZO surface is subjected to the plasma bombardment treatment with $N_2O$ and $N_2$, the mobility μ of the TFT device of the present disclosure is increased by 0.22 in comparison to the mobility p of the prior art TFT device. Correspondingly, as shown in FIG. 7, the sub-threshold swing S of the TFT device of the present disclosure is reduced by 0.06 in comparison to that of the prior art. As shown in FIG. 8, a change in hysteresis ΔHysteresis (i.e., a difference between the threshold voltages Vth(reverse)−Vth(forward)) of the TFT device of the present disclosure is reduced by 0.22 in comparison to that of the prior art. In summary, it can be seen that the TFT device manufactured by treatment with $N_2O$ and $N_2$ can exhibit more stable characteristics. This is because the IGZO is subjected to a surface plasma treatment with $N_2O$ and $N_2$. On the one hand, $N_2$ exhibits a good effect in treating the roughness of the IGZO surface. On the other hand, the effect of the $N_2O$ plasma on the IGZO surface allows an effective suppression of detects and a reduction of oxygen vacancies on the IGZO back channel. Thus, the IGZO exhibits more stable characteristics due to fewer defects and oxygen vacancies on the IGZO back channel during the test with light irradiation and negative bias.

FIG. 6 is a graph showing comparison of Δμ test results of thin film transistors according to the embodiments of the present disclosure and the prior art, FIG. 7 is a graph showing comparison of ΔS test results of thin film transistors according to the embodiments of the present disclosure and the prior art, and FIG. 8 is a graph showing comparison of ΔHysteresis test results of thin film transistors according to the embodiments of the present disclosure and the prior art.

It should be noted that, as shown in FIG. 6 to FIG. 8 and as can be seen therefrom, the optimal process conditions in the second solution and in the third solution have a significant effect of improving the LNBT characteristics of the TFT device. Specifically, the third solution allows a characteristic shift in the negative direction to be reduced by 8 V in comparison to the prior art process, which indicates that this process has a better effect of ameliorating the damage and roughness of the IGZO surface during etching so as to improve the quality of the IGZO surface, thereby effectively solving the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching. In addition, the third solution of the present disclosure under the optimal process conditions exhibits a superior ΔS value and ΔHysteresis value, both of which show a tendency to be reduced compared with those of the prior art process. Therefore, it is shown that a method for manufacturing a thin film transistor according to an embodiment of the present disclosure contributes to the optimization of characteristics of the IGZO back channel and can improve the stability of the characteristics of the TFT device to a certain extent.

Figure 9:
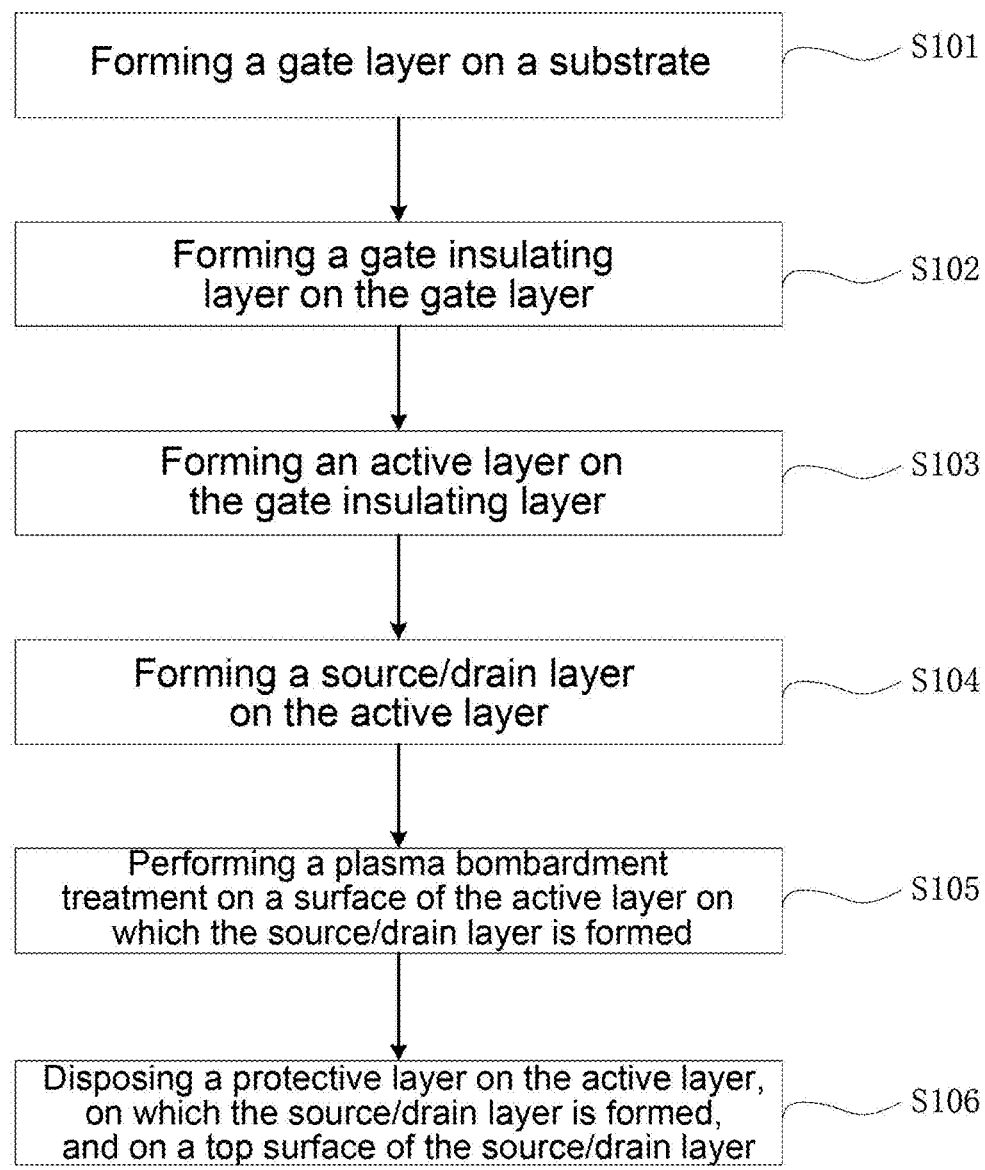
FIG. 9 is a schematic flowchart of another method for manufacturing a thin film transistor according to an embodiment of the present disclosure.

FIG. 9 is a schematic flowchart of another method for manufacturing a thin film transistor according to an embodiment of the present disclosure.

Optionally, in this embodiment, in order to achieve a better effect of protecting the thin film transistor, after the plasma bombardment treatment is performed on the surface of the active layer on which the source/drain layer is formed, the method may further comprise:

step S106 of disposing a protective layer on the active layer on which the source/drain layer is formed and on a top surface of the source/drain layer.

Optionally, in this embodiment, it should be noted that, after the protective layer is formed on the active layer on which the source/drain layer is formed and on the top surface of the source/drain layer, a certain effect of protecting the electrical properties of the device can be achieved. Specifically, when the protective layer is manufactured, the electrical characteristics of the device can be kept substantially unchanged within a short period of time.

Optionally, in this embodiment, the protective layer of the TFT device for achieving a certain effect of protecting the TFT device may be formed by coating the active layer on which the source/drain layer is formed and the top surface of the source/drain layer with a different type of photoresist. It should be noted that, in the embodiments of the present disclosure, the protective layer may also be formed by coating the active layer on which the source/drain layer is formed and the top surface of the source/drain layer with other materials capable of keeping the electrical characteristics of the TFT device substantially unchanged.

An embodiment of the present disclosure may further provide a thin film transistor manufactured by any of the methods described above.

Optionally, in this embodiment, it should be noted that the thin film transistor can solve the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

The present disclosure may further provide a display apparatus. The display apparatus may comprise the thin film transistor in the above embodiment. The display apparatus may specifically be a display panel or any other display apparatus comprising a thin film transistor, for example, any of products or components with display functions such as liquid crystal display apparatuses, OLED display apparatuses, electronic papers, mobile phones, tablet computers, televisions, laptops, digital photo frames, and navigators.

Because of comprising the thin film transistor described above which shows a reduced shift in the negative direction, has stable characteristics, and is less susceptible to aging, the display apparatus according to this embodiment solves the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

In the description of the present disclosure, it should be understood that the terms "including" and "comprising" and any variants thereof used herein are intended to cover non-exclusive inclusions, and for example, a process, method, system, product, or device that includes a list of steps or units is not necessarily limited to those steps or units expressly listed, but may include other steps or units not expressly listed or inherent to such a process, method, product, or device. In addition, the terms "first", "second", and the like are used for descriptive purposes only, and should not be understood as an indication or implication of relative importance or an implicit indication of the number of the indicated technical features. Therefore, a feature defined with the terms "first" and "second" may explicitly or implicitly include one or more such features.

Finally, it should be noted that the above embodiments are merely intended to illustrate the technical solutions of the present disclosure, but not intended to limit the present disclosure. Although the present disclosure has been described in detail with reference to the foregoing embodiments, it should be understood by those of ordinary skill in the art that the technical solutions disclosed in the foregoing embodiments may still be modified, or some or all of the technical features thereof may be replaced with equivalents; and such modifications or replacements will not cause the essence of the corresponding technical solutions to depart from the scope of the technical solutions of the embodiments of the present disclosure.

INDUSTRIAL APPLICABILITY

In a method for manufacturing a thin film transistor, a thin film transistor, and a display apparatus according to the embodiments of the present disclosure, a plasma bombardment treatment is performed on a surface of an active layer on which a source/drain layer is formed, so that the micro-level activity of the surface of the treated material (i.e., IGZO) can be enhanced. In this way, not only a damage of the IGZO surface and an increase in roughness of the IGZO surface during etching can be minimized so as to guarantee the quality of the IGZO surface, but also a coating effect can be significantly improved, thereby effectively solving the problems of the prior art TFT devices which have characteristics severely shifted in the negative direction and are susceptible to aging and other problems associated with poor product reliability, due to increased defects on the IGZO surface caused by the damage of the IGZO surface and the increase in roughness of the IGZO surface during etching.

What is claimed is:

1. A method for manufacturing a thin film transistor, comprising:
    forming a gate layer on a substrate;
    forming a gate insulating layer on the gate layer;
    forming an active layer on the gate insulating layer;
    forming a source/drain layer on the active layer; and
    performing a plasma bombardment treatment on a surface of the active layer on which the source/drain layer is formed, and controlling the plasma bombardment treatment to be performed at a gas flow rate of 4K sccm to 70K sccm, at a pressure of 600 mTorr to 1200 mTorr, at a power of 4 KW to 12 KW for a treatment time of 10 s to 60 s.

2. The method for manufacturing a thin film transistor according to claim 1, wherein the performing a plasma bombardment treatment on a surface of the active layer on which the source/drain layer is formed comprises:
    performing the plasma bombardment treatment by using at least one gas of $N_2O$, $O_2$, Ar, and $N_2$ on the surface of the active layer on which the source/drain layer is formed, and controlling the gas flow rate in a range of 4K sccm to 70K sccm, the pressure in a range of 600 mTorr to 1200 mTorr, the power in a range of 4 KW to 12 KW, and the treatment time in a range of 10 s to 60 s.

3. The method for manufacturing a thin film transistor according to claim 1, wherein the performing a plasma bombardment treatment on a surface of the active layer on which the source/drain layer is formed comprises:
    performing the plasma bombardment treatment by using one gas of $N_2O$, $O_2$, Ar, and $N_2$ on the surface of the active layer on which the source/drain layer is formed, and controlling the gas flow rate in a range of 30K sccm to 70K sccm, the pressure in a range of 600 mTorr to 1200 mTorr, the power in a range of 4 KW to 12 KW, and the treatment time in a range of 10 s to 40 s.

4. The method for manufacturing a thin film transistor according to claim 1, wherein the performing a plasma bombardment treatment on a surface of the active layer on which the source/drain layer is formed comprises:
    performing the plasma bombardment treatment by using two gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

5. The method for manufacturing a thin film transistor according to claim 2, wherein a ratio of the gas flow rates of the two gases of $N_2O$, $O_2$, Ar, and $N_2$ is between 1:4 and 4:1.

6. The method for manufacturing a thin film transistor according to claim 1, wherein the performing a plasma bombardment treatment on a surface of the active layer on which the source/drain layer is formed comprises:

performing the plasma bombardment treatment by using three gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

7. The method for manufacturing a thin film transistor according to claim 1, wherein the performing a plasma bombardment treatment on a surface of the active layer on which the source/drain layer is formed comprises:

performing the plasma bombardment treatment by using a gas mixture of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

8. The method for manufacturing a thin film transistor according to claim 1, wherein the plasma bombardment treatment on the surface of the active layer on which the source/drain layer is formed is performed in a chemical vapor deposition equipment or a dry etching equipment.

9. The method for manufacturing a thin film transistor according to claim 1, wherein the plasma bombardment treatment on the surface of the active layer on which the source/drain layer is formed is automatically controlled by a digital control technology.

10. The method for manufacturing a thin film transistor according to claim 1, wherein the plasma bombardment treatment on the surface of the active layer on which the source/drain layer is formed is performed in vacuum.

11. The method for manufacturing a thin film transistor according to claim 1, after performing the plasma bombardment treatment on the surface of the active layer on which the source/drain layer is formed, further comprising:

disposing a protective layer on the active layer, on which the source/drain layer is formed, and on a top surface of the source/drain layer.

12. The method for manufacturing a thin film transistor according to claim 11, wherein the protective layer is formed by coating different types of photoresist on the active layer, on which the source/drain layer is formed, and on the top surface of the source/drain layer.

13. A thin film transistor, manufactured by using the method according to claim 1.

14. A display apparatus, comprising at least the thin film transistor according to claim 13.

15. The method for manufacturing a thin film transistor according to claim 2, wherein the performing a plasma bombardment treatment on a surface of the active layer on which the source/drain layer is formed comprises:

performing the plasma bombardment treatment by using one gas of $N_2O$, $O_2$, Ar, and $N_2$ on the surface of the active layer on which the source/drain layer is formed, and controlling the gas flow rate in a range of 30K sccm to 70K sccm, the pressure in a range of 600 mTorr to 1200 mTorr, the power in a range of 4 KW to 12 KW, and the treatment time in a range of 10 s to 40 s.

16. The method for manufacturing a thin film transistor according to claim 2, wherein the performing a plasma bombardment treatment on a surface of the active layer on which the source/drain layer is formed comprises:

performing the plasma bombardment treatment by using two gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

17. The method for manufacturing a thin film transistor according to claim 2, wherein the performing a plasma bombardment treatment on a surface of the active layer on which the source/drain layer is formed comprises:

performing the plasma bombardment treatment by using three gases of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

18. The method for manufacturing a thin film transistor according to claim 2, wherein the performing a plasma bombardment treatment on a surface of the active layer on which the source/drain layer is formed comprises:

performing the plasma bombardment treatment by using a gas mixture of $N_2O$, $O_2$, Ar, and $N_2$ on the surface of the active layer on which the source/drain layer is formed, and controlling the gas flow rate in a range of 4K sccm to 8K sccm, the pressure in a range of 600 mTorr to 1200 mTorr, the power in a range of 3 KW to 9 KW, and the treatment time in a range of 10 s to 60 s.

19. The method for manufacturing a thin film transistor according to claim 2, wherein the plasma bombardment treatment on the surface of the active layer on which the source/drain layer is formed is performed in a chemical vapor deposition equipment or a dry etching equipment.

20. The method for manufacturing a thin film transistor according to claim 2, wherein the plasma bombardment treatment on the surface of the active layer on which the source/drain layer is formed is automatically controlled by a digital control technology.

* * * * *